(12) United States Patent
Mühlfeld et al.

(10) Patent No.: US 12,444,670 B2
(45) Date of Patent: Oct. 14, 2025

(54) POWER MODULE (71) Applicant: Danfoss Silicon Power GmbH, Flensburg (DE)

(72) Inventors: Ole Mühlfeld, Nordborg (DK); Klaus Olesen, Nordborg (DK); Matthias Beck, Nordborg (DK); Holger Ulrich, Nordborg (DK); Martin Becker, Nordborg (DK)

(73) Assignee: DANFOSS SILICON POWER GMBH, Flensburg (DE)

( * ) Notice: Subject to any disclaimer, the term of this patent is extended or adjusted under 35 U.S.C. 154(b) by 531 days.

(21) Appl. No.: 17/909,471

(22) PCT Filed: Mar. 8, 2021

(86) PCT No.: PCT/EP2021/055804
§ 371 (c)(1),
(2) Date: Sep. 6, 2022

(87) PCT Pub. No.: WO2021/180660
PCT Pub. Date: Sep. 16, 2021

(65) Prior Publication Data
US 2023/0114396 A1 Apr. 13, 2023

(30) Foreign Application Priority Data
Mar. 9, 2020 (DE) .................. 10 2020 106 385.7

(51) Int. Cl.
*H01L 23/498* (2006.01)
*H01L 23/373* (2006.01)

(52) U.S. Cl.
CPC .... *H01L 23/49811* (2013.01); *H01L 23/3735* (2013.01)

(58) Field of Classification Search
CPC .......... H01L 23/49811; H01L 23/3735; H01L 2224/0603; H01L 2224/291; H01L 2224/2919; H01L 2224/32225; H01L 25/18; H01L 2224/32238; H01L 2224/48177; H01L 2224/48227;
(Continued)

(56) References Cited

U.S. PATENT DOCUMENTS

2013/0148314 A1* 6/2013 Hirai .................... H01L 25/165
361/748
2013/0286617 A1 10/2013 Shibasaki et al.
(Continued)

FOREIGN PATENT DOCUMENTS

| DE | 10 2020 106 385 A1 | 9/2021 |
| EP | 2 034 521 A2 | 3/2009 |
| JP | S58-42489 A | 3/1983 |

OTHER PUBLICATIONS

International Search Report mailed Jul. 5, 2021, in connection with International Application No. PCT/EP2021/055804; 3 pages.

*Primary Examiner* — Patricia D Valenzuela
(74) *Attorney, Agent, or Firm* — McCormick, Paulding & Huber PLLC (57) ABSTRACT

A power module (2) including a rigid insulated substrate (10) mounted on a baseplate (4) is disclosed. An additional circuit carrier (6, 8) is mounted on the baseplate (4) adjacent to the rigid insulated substrate (10). The additional circuit carrier (6, 8) has a rigidity which is less than that of the rigid insulated substrate (10).

11 Claims, 5 Drawing Sheets

(58) Field of Classification Search
CPC . H01L 2224/49111; H01L 2224/73265; H01L 2224/8384; H01L 25/072; H01L 23/5385
See application file for complete search history.

(56) References Cited

U.S. PATENT DOCUMENTS

2015/0084179 A1     3/2015   Hatori
2018/0301354 A1*   10/2018   Osterwald ........... H01L 21/4846

* cited by examiner

POWER MODULE

CROSS-REFERENCE TO RELATED APPLICATION

This application is a National Stage application of International Patent Application No. PCT/EP2021/055804, filed on Mar. 8, 2021, which claims priority to German Patent Application No. 10 2020 106 385.7, filed on Mar. 9, 2020, each of which is hereby incorporated by reference in its entirety.

TECHNICAL FIELD

The present generally invention relates to a power module. The present more particularly relates to a power module comprising a rigid insulated substrate mounted on a baseplate.

BACKGROUND

Direct bonded copper (DBC) substrates are widely used in power modules because of their very good thermal conductivity. A DBC substrate is composed of a ceramic layer with a sheet of copper bonded to one or both sides. To provide a sufficient cooling a DBC substrate, the substrate is typically attached to a heat spreader e.g. by soldering the bottom copper layer of the DBC substrate to the heat spreader.

DBC substrates are selected as circuit material for bare semiconductor chips in power modules as they efficiently dissipate the waste heat from the semiconductors and increase the lifetime of the modules. Process and production engineers, however, initially have to build these modules. This task requires joining and connecting multiple components with care to provide the required electrical, thermal, chemical and mechanical functions.

Although DBC substrates are advantageous in terms of their capacity to dissipate waste heat, this capacity is typically not required throughout the power module. In fact, in those areas in which the heat generation is low or absent, a very low capacity to dissipate waste heat is required. Since DBC substrates are expensive, it would be desirable to be able to provide an alternative suitable for construction of power modules.

Accordingly, it is an object of the present invention to provide a power module that reduces or even eliminates the above-mentioned disadvantage of the prior art. It is an object of the present invention to provide a power module, that is less expensive than the prior art power modules.

SUMMARY

The object of the present invention can be achieved by a power module as defined in claim 1. Preferred embodiments are defined in the dependent subclaims, explained in the following description and illustrated in the accompanying drawings.

The power module according to the invention is a power module comprising a rigid insulated substrate mounted on a baseplate, wherein an additional circuit carrier is mounted on the baseplate adjacent to the rigid insulated substrate, wherein the additional circuit carrier has a rigidity which is less than that of the rigid insulated substrate.

Hereby, it is possible to provide a power module, that is less expensive than the prior art power modules. The cost of the power module can be reduced by decreasing the area of the rigid insulated substrate by applying the additional circuit carrier.

The rigid insulated substrate and the additional circuit carrier may be attached to the baseplate by using any suitable attachment method. A solder layer, a sinter layer or glue (thermally and/or electrically conducting) may be used to electrically connect and mechanically fasten the rigid insulated substrate and the additional circuit carrier to the baseplate. Likewise, power components may be electrically connected and mechanically fastened to the rigid insulated substrate by using a solder layer, a sinter layer or glue (thermally and/or electrically conducting).

In one embodiment, the rigid insulated substrate is a ceramic insulated substrate.

In a preferred embodiment, the rigid insulated substrate is an insulated metal substrate.

It may be an advantage that the rigid insulated substrate is a DBC substrate.

In one embodiment, the rigid insulated substrate is a direct bonded aluminium (DBA) substrate.

In one embodiment, the rigid insulated substrate is an active metal braze (AMB) substrate.

In one embodiment, the additional circuit carrier is electrically connected to one or more components arranged on the rigid insulated substrate.

In one embodiment, the additional circuit carrier is electrically connected to one or more components arranged on a DBC substrate.

It may be advantageous, that the additional circuit carrier has a power consumption of below 200 W/cm$^2$ during operation. Hereby, a sufficient cooling of the additional circuit carrier can be achieved.

In one embodiment, components mounted on or using the additional circuit carrier have a power consumption of below 100 W/cm$^2$ during operation. Hereby, a sufficient cooling of the additional circuit carrier can more easily be achieved.

In one embodiment, the additional circuit carrier has a power consumption of below 50 W/cm$^2$ during operation.

In one embodiment, the additional circuit carrier has a power consumption of below 25 W/cm$^2$ during operation.

In one embodiment, the additional circuit carrier is a printed circuit board (PCB).

In one embodiment, the PCB is a glass-reinforced epoxy laminate material composed of woven fiberglass cloth with an epoxy resin binder that is flame resistant. Such PCB is sometimes referred to as a FR-4 (or FR4).

It may be an advantage that the additional circuit carrier is a flexible circuit board. Hereby, it is possible to arrange the flexible circuit board in a configuration, in which the flexible circuit board extends out of the power module casing. Such embodiment allows for connecting flexible circuit board to an adjacent PCB (e.g. a PCB on which the driver circuit supplies signals to drive the switches in the power module).

Using a flexible circuit board is advantageous because the flexible circuit board can be arranged in a configuration, in which it protrudes out of the casing of the power module without the use of a plug or socket.

In one embodiment, the additional circuit carrier protrudes from the casing of the power module.

In one embodiment, the additional circuit carrier is a flexible circuit board that protrudes from the casing of the power module.

In one embodiment, the additional circuit carrier is bonded directly on the baseplate. Mounting the additional circuit carrier (e.g. a flexible circuit board) directly on the baseplate makes it possible to arrange components on parts of the flex circuit in order to create a full driver circuit or a portion of a driver circuit.

In one embodiment, the DBC substrate covers less than 90% of the area of the baseplate. Hereby, the additional circuit carrier may constitute at least 10% of the area of the (top side of the) baseplate.

In one embodiment, the DBC substrate covers less than 80% of the area of the (top side of the) baseplate.

In one embodiment, the DBC covers less than 70% of the area of the (top side of the) baseplate.

In one embodiment, the DBC substrate covers less than 60% of the area of the (top side of the) baseplate.

In one embodiment, the DBC substrate covers less than 50% of the area of the (top side of the) baseplate.

It may be an advantage that the additional circuit carrier is thinner than the DBC substrate. By applying an additional circuit carrier is thinner than the DBC substrate it is possible to reduce the cost of the power module.

It may be advantageous that the additional circuit carrier comprises a L-shaped or C-shaped portion extending at least partly along a first side and a second side of the DBC substrate.

In one embodiment, the additional circuit carrier comprises a portion that is E-shaped. It may be beneficial that the E-shaped additional circuit carrier extends at least partly along a first side and a second side of the DBC substrate.

In one embodiment, the additional circuit carrier is L-shaped.

In one embodiment, the additional circuit carrier is C-shaped.

In one embodiment, the additional circuit carrier comprises one or more connection structures provided in the distal end of the additional circuit carrier.

In one embodiment, the additional circuit carrier comprises one or more connection structures provided in the distal end of a portion of the additional circuit carrier that protrudes from the casing of the power module.

In one embodiment, the additional circuit carrier is a flexible circuit board that comprises one or more connection structures provided in the distal end of a portion of the flexible circuit board that protrudes from the casing of the power module.

In one embodiment, at least a portion of the additional circuit carrier is non-planar.

By the term "non-planar" is meant "not lying or able to be confined within a single plane".

In one embodiment, at least a portion of the non-planar portion is an arced portion.

It may be advantageous that the additional circuit carrier comprises several layers.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings.

DETAILED DESCRIPTION

Figure 1A:
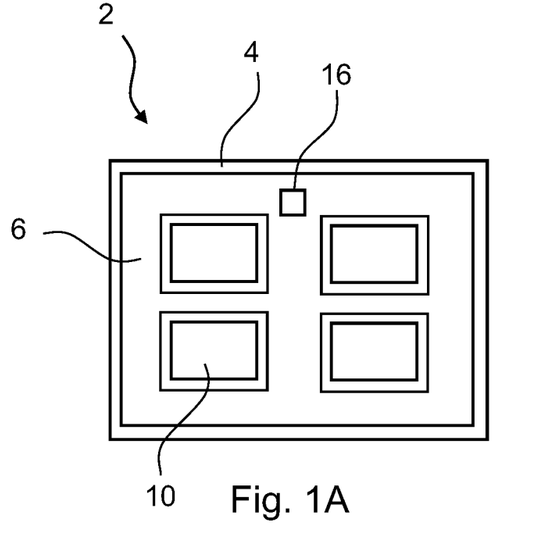
FIG. 1A shows a schematic top view of a power module according to the invention.

Referring now in detail to the drawings for the purpose of illustrating preferred embodiments of the present invention, a power module 2 of the present invention is illustrated in FIG. 1A.

FIG. 1A is a schematic top view of a power module 2 according to the invention. The power module 2 comprises a baseplate 4 and a PCB 6 attached thereto. The power module 2 also comprises a plurality of rigid insulated substrates 10. The rigid insulated substrates 10 may be formed as direct bonded copper (DBC) substrates. The rigid insulated substrates 10 are individually spaced and surrounded by a portion of the PCB 6. The power module 2 comprises a signal connector 16 arranged close to the periphery of the power module 2.

When comparing the surface area of the PCB 6 and the rigid insulated substrates 10, it can be seen that the surface area of the PCB 6 is significantly larger than the surface area of the rigid insulated substrates 10. Since the rigid insulated substrates 10 are expensive, the total cost of the power module 2 can be reduced by applying the PCB 6 instead of solely using rigid insulated substrates 10 to cover the baseplate 4.

Figure 1B:
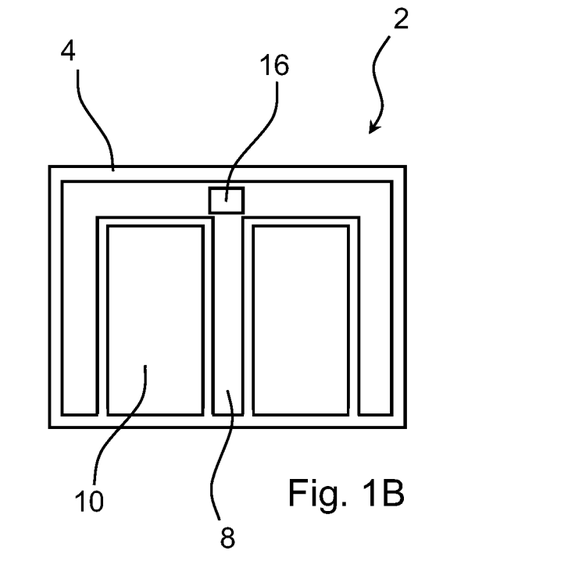
FIG. 1B shows a schematic top view of another power module according to the invention.

FIG. 1B illustrates a schematic top view of another power module 2 according to the invention. The power module 2 comprises a baseplate 4 onto which a flexible circuit board 8 is attached. The power module 2 also comprises two rigid insulated substrates 10 separated from each other. The rigid insulated substrates 10 are formed as DBC substrates. A signal connector 16 arranged close to the periphery of the power module 2.

The surface area of the flexible circuit board 8 is basically corresponds to the surface area of the rigid insulated substrates 10. Hereby, the use of the flexible circuit board 8 total makes it possible to reduce the cost of the power module 2.

Figure 1C:
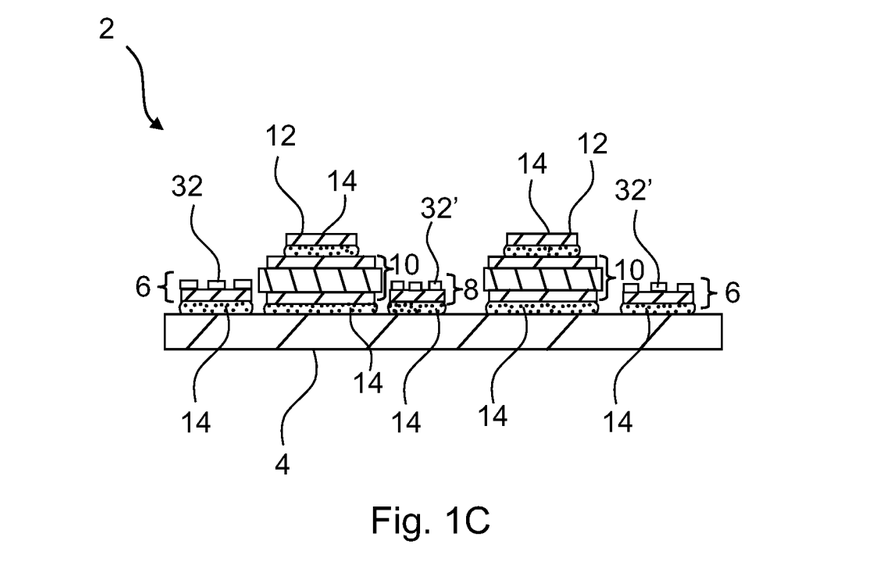
FIG. 1C shows a cross-sectional view of a power module according to the invention.

FIG. 1C illustrates a cross-sectional view of a power module 2 according to the invention. The power module 2 comprises a baseplate 4. Two rigid insulated substrates 10 are mounted on the baseplate 4. The rigid insulated substrates 10 are fixed to the baseplate 4 by means of a joining material 14 that may be a solder layer, a sinter layer or glue (thermally and/or electrically conducting).

A flexible circuit board 8 provided with tracks 32' is mounted on the baseplate 4 between the two rigid insulated substrates 10. A PCB 6 provided with tracks 32, 32' is placed adjacent to each of the two rigid insulated substrates 10. The flexible circuit board 8 as well as the PCB's 6 are fixed to the baseplate 4 by using a joining material 14. The joining material 14 may be a solder layer, a sinter layer or a glue. A semiconductor 12 is placed on the top of each of the two rigid insulated substrates 10. The rigid insulated substrates 10 may be DBC substrates.

Figure 2A:
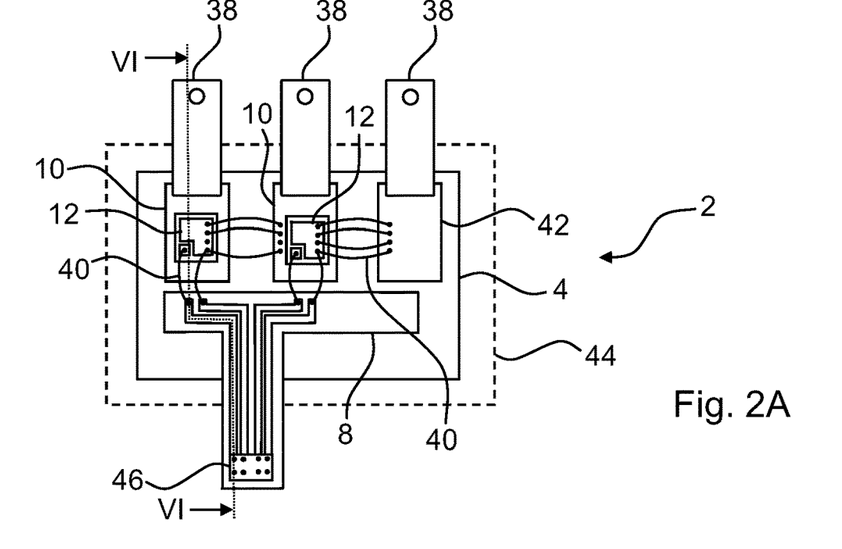
FIG. 2A shows a schematic top view of a power module according to the invention.

FIG. 2A illustrates a schematic top view of a power module 2 according to the invention. The power module 2 comprises a baseplate 4 arranged within a package (casing) having an edge 44 indicated with a dotted line.

The power module 2 is provided with three power connectors 38 protruding from the edge of the power module molding 44. Two of the power connectors 38 are electrically connected to a rigid insulated substrate (e.g. a DBC substrate) 10. The power connectors 38 arranged to the right, however, is electrically connected to a structure (plate) 42. The structure 42 may be a rigid insulated substrate.

Since no power components are arranged on the structure 42, there is no need for a high capacity to dissipate waste heat. Accordingly, the structure 42 may be a PCB or a flexible circuit board.

A semiconductor 12 is placed on each of the rigid insulated substrates 10 arranged to the left from the structure 42. Wire bonds 40 are used to electrically connect the semiconductors 12 to the adjacent rigid insulated substrate 10 or structure 42. Wire bonds 40 are also used to electrically connect the semiconductor 12 to tracks of a flexible circuit board 8.

The flexible circuit board 8 comprises a portion protruding from the edge of the power module molding 44. Hereby, the flexible circuit board 8 constitutes a structure having a function of a "plug" 46 that is accessible from the outside of the power module molding 44. The "plug" 46 may preferably comprise both control and sensing connections. The use of such a flexible circuit board that protrudes from the module allows opportunities for connection that are not available to prior art modules where connections have to be made close to the module molded surface. In this embodiment of the invention the connections may be made some way from the module's molded surface, enabling connections to be made on different planes, or at angles, which were not available with short, rigid connections. The distance from the module's molded surface may also improve creepage or clearance restrictions where relevant.

Figure 2B:
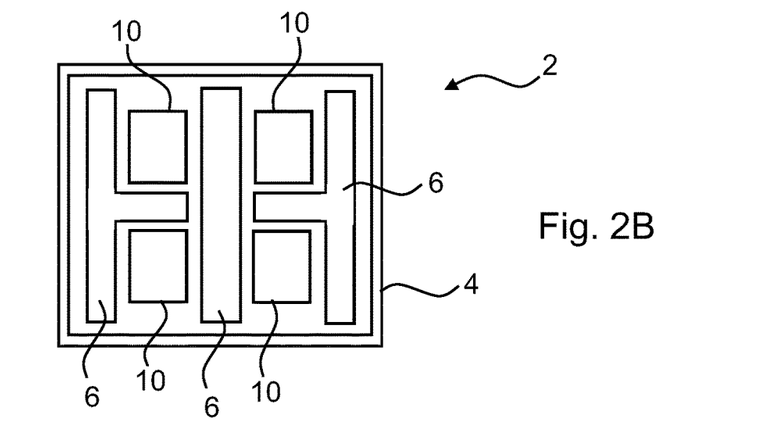
FIG. 2B shows a schematic top view of another power module according to the invention.

FIG. 2B illustrates a schematic top view of another power module 2 according to the invention. The power module 2 comprises a baseplate 4 and a flexible circuit board 8 arranged on the baseplate 4. Two symmetrically arranged T-shaped PCB's 6 and an elongated rectangular PCB 6 arranged therebetween. Furthermore, the power module 2 comprises four rigid insulated substrates 10.

Figure 2C:
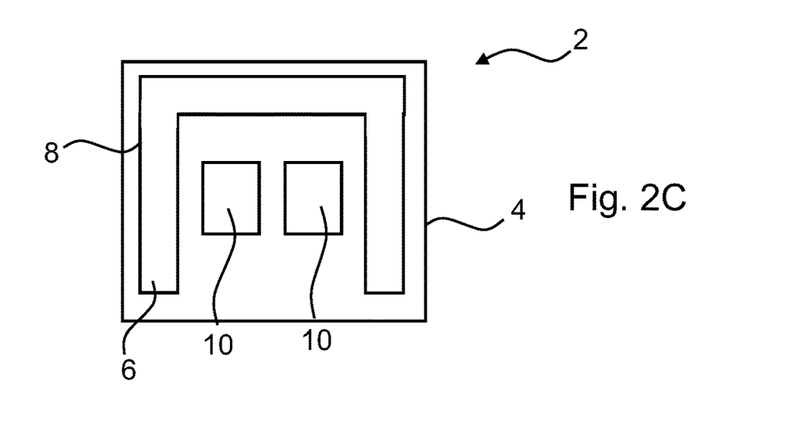
FIG. 2C shows a schematic top view of a further power module according to the invention.

FIG. 2C illustrates a schematic top view of a further power module 2 according to the invention. The power module 2 comprises a baseplate 4 onto which a C-shaped flexible circuit board 8 is arranged. The power module 2 comprises two centrally arranged rigid insulated substrates 10.

Figure 3A:
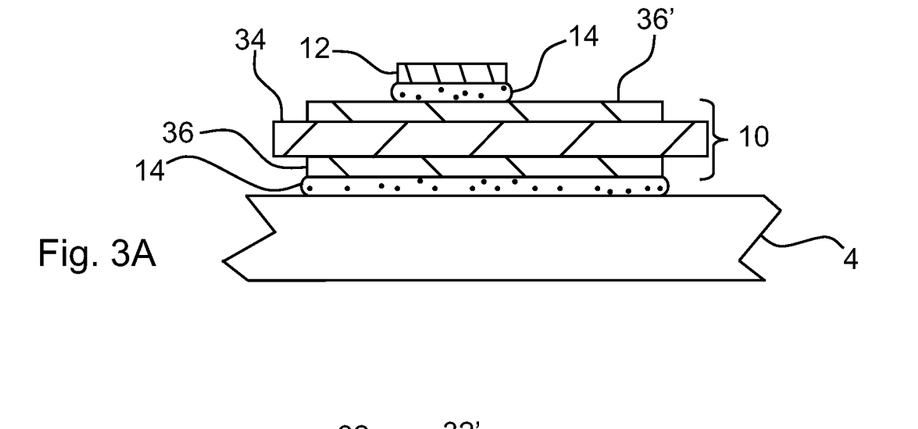
FIG. 3A shows a cross-sectional view of a portion of a power module according to the invention comprising a rigid insulated substrate attached to a baseplate.

FIG. 3A illustrates cross-sectional view of a portion of a power module according to the invention comprising a rigid insulated substrate 10 attached to a baseplate 4. The power module comprises a baseplate 4 and a rigid insulated substrate 10 fixed thereto by means of a joining material 14 such as a solder layer, a sinter layer or a glue. The rigid insulated substrate 10 comprises an insulator 34 sandwiched between a lower metal plate 36 and an upper metal plate 36'. A semiconductor 12 is attached to the top side of the upper metal plate 36' my means of a joining material 14 (e.g. a solder layer, a sinter layer or a glue).

Figure 3B:
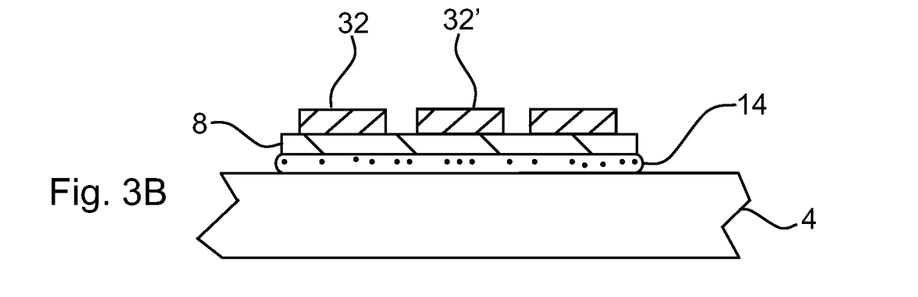
FIG. 3B shows a cross-sectional view of a portion of a power module according to the invention comprising a flexible circuit board.

FIG. 3B illustrates a cross-sectional view of a portion of a power module according to the invention comprising a flexible circuit board 8 attached to a baseplate 4 by means of a joining material 14 (e.g. a solder layer, a sinter layer or a glue). A plurality of separated metal tracks 32, 32' are provided on the top of the flexible circuit board 8.

Figure 3C:
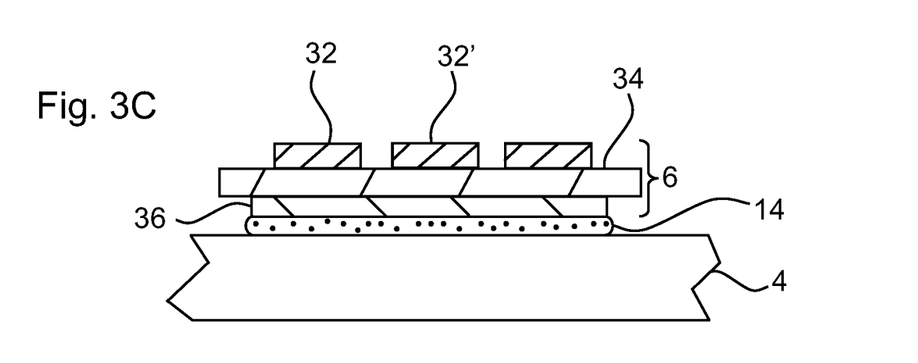
FIG. 3C shows a cross-sectional view of a power module according to the invention.

FIG. 3C illustrates a cross-sectional view of a portion of a power module according to the invention comprising a baseplate 4 and a PCB 6 attached thereto by means of a joining material 14 which may be a solder layer, a sinter layer or a glue. The PCB 6 comprises an insulator 34 sandwiched between a metal layer 36 and three metal tracks 32, 32'.

Figure 4:
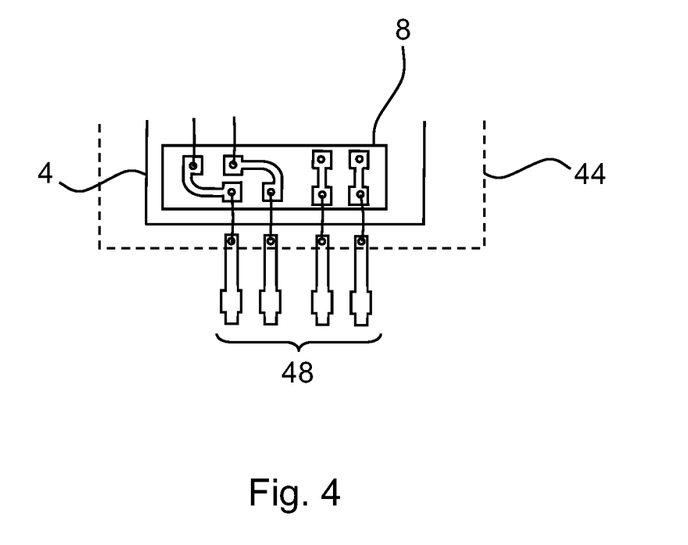
FIG. 4 shows a top view of an edge of the power module molding according to the invention.

FIG. 4 illustrates a top view of a portion of a power module comprising alternative external connections. It can be seen that the power module comprises control and sensing connections 48 protruding from the edge of the power module molding 44. The sensing connections 48 are electrically connected to a flexible circuit board 8 arranged on a baseplate 4 of the power module.

Figure 5:
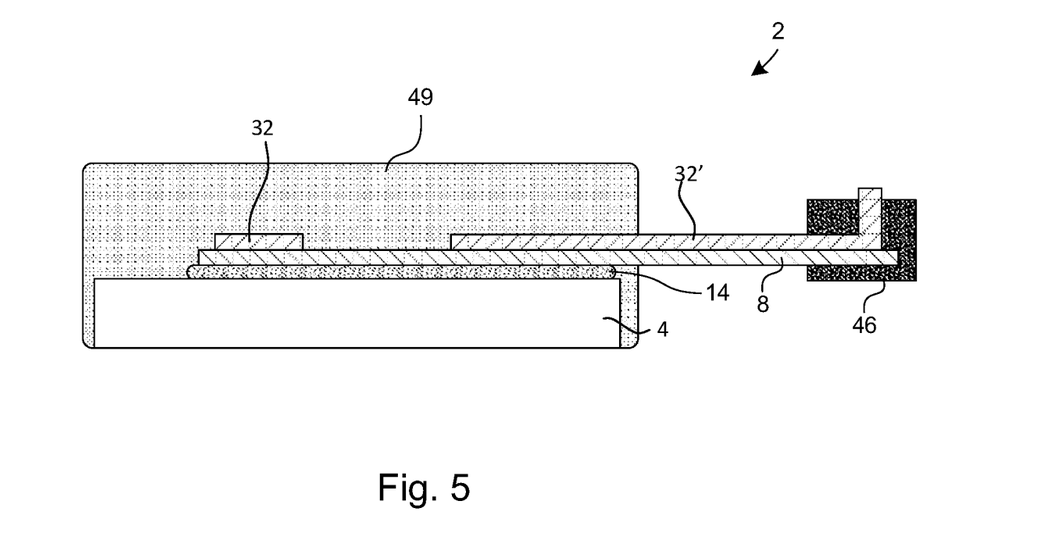
FIG. 5 shows a cross-sectional view of a power module according to the invention and FIG. 6 shows a cross-sectional view of a power module according to the invention.

FIG. 5 shows a cross-sectional view of a power module according to the invention. The power module 2 comprises a baseplate 4 arranged within a molded package (casing) 49. A flexible circuit board 8 provided with tracks 32, 32' is mounted on the baseplate 4. The flexible circuit board 8 is fixed to the baseplate 4 by using a joining material 14. The joining material 14 may be a solder layer, a sinter layer or a glue. The flexible circuit board 8 comprises a portion protruding from the edge of the power module molding 49. Hereby, the flexible circuit board 8 constitutes a structure having a function of a "plug" 46 that is accessible from the outside of the power module molding 49. The "plug" 46 may preferably comprise both control and sensing connections.

Figure 6:
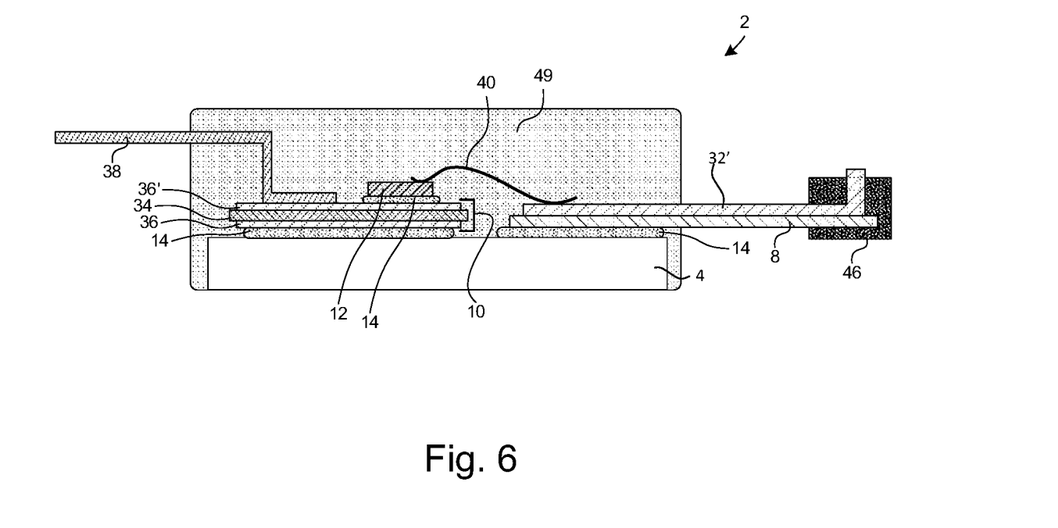

FIG. 6 shows a cross-sectional view of a power module according to the invention in an embodiment illustrated in FIG. 2A and represents a cross-section along the line marked "VI-VI" in FIG. 2A. The power module 2 comprises a baseplate 4 arranged within a molded package (casing) 49. The power module 2 is provided a power connector 38 protruding from the power module molding 49. The power connector 38 is electrically connected to a rigid insulated substrate (e.g. a DBC substrate) 10. A semiconductor 12 is placed on the rigid insulated substrate 10. A wire bond 40 is used to electrically connect the semiconductor 12 to a track 32' of a flexible circuit board 8. The flexible circuit board 8 comprises a portion protruding from the edge of the power module molding 49. Hereby, the flexible circuit board 8 constitutes a structure having a function of a "plug" 46 that is accessible from the outside of the power module molding 44. The "plug" 46 may preferably comprise both control and sensing connections.

While the present disclosure has been illustrated and described with respect to a particular embodiment thereof, it should be appreciated by those of ordinary skill in the art that various modifications to this disclosure may be made without departing from the spirit and scope of the present disclosure.

The invention claimed is:

1. A power module comprising a rigid insulated substrate mounted on a baseplate, wherein an additional circuit carrier is mounted on the baseplate adjacent to the rigid insulated substrate, wherein the additional circuit carrier has a rigidity which is less than that of the rigid insulated substrate.

2. The power module according to claim 1, wherein the additional circuit carrier is a printed circuit board (PCB).

3. The power module according to claim 1, wherein the additional circuit carrier is a flexible circuit board.

4. The power module according to claim 1, wherein the additional circuit carrier is bonded directly on the baseplate.

5. The power module according to claim 1, wherein the rigid insulated substrate covers less than 90% of the area of the baseplate.

6. The power module according to claim 1, wherein the additional circuit carrier is thinner than the rigid insulated substrate.

7. The power module according to claim 1, wherein the additional circuit carrier comprises a portion that is L-shaped or C-shaped portion extending at least partly along a first side and a second side of the rigid insulated substrate.

8. The power module according to claim 1, wherein the additional circuit carrier comprises one or more connection structures provided in the distal end of the additional circuit carrier.

9. The power module according to claim 1, wherein at least a portion of the additional circuit carrier is non-planar.

10. The power module according to claim 1, wherein the additional circuit carrier comprises several layers.

11. The power module according to claim 1, wherein the rigid insulated substrate is a direct bonded copper (DBC) substrate.

* * * * *